US009698235B2

(12) United States Patent
Migita et al.

(10) Patent No.: US 9,698,235 B2
(45) Date of Patent: Jul. 4, 2017

(54) FIELD-EFFECT TRANSISTOR

(71) Applicant: NATIONAL INSTITUTE OF ADVANCED INDUSTRIAL SCIENCE AND TECHNOLOGY, Tokyo (JP)

(72) Inventors: Shinji Migita, Ibaraki (JP); Hiroyuki Ota, Ibaraki (JP); Koichi Fukuda, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/031,110

(22) PCT Filed: Aug. 12, 2014

(86) PCT No.: PCT/JP2014/071254
§ 371 (c)(1),
(2) Date: Apr. 21, 2016

(87) PCT Pub. No.: WO2015/059986
PCT Pub. Date: Apr. 30, 2015

(65) Prior Publication Data
US 2016/0308019 A1 Oct. 20, 2016

(30) Foreign Application Priority Data

Oct. 22, 2013 (JP) .................................. 2013-218870

(51) Int. Cl.
*H01L 21/02* (2006.01)
*H01L 29/51* (2006.01)
(Continued)

(52) U.S. Cl.
CPC ...... *H01L 29/513* (2013.01); *H01L 21/02197* (2013.01); *H01L 21/02266* (2013.01);
(Continued)

(58) Field of Classification Search
CPC . H01L 29/513; H01L 29/1033; H01L 29/517; H01L 29/78; H01L 29/0847;
(Continued)

(56) References Cited

U.S. PATENT DOCUMENTS 5,198,994 A * 3/1993 Natori .................... G11C 11/22
257/295
6,242,771 B1 6/2001 Hsu et al.
(Continued)

OTHER PUBLICATIONS

International Search Report mailed on Nov. 18, 2014, for corresponding International Patent Application No. PCT/JP2014/071254. (With English Translation).
(Continued)

*Primary Examiner* — Thanh Y Tran
(74) *Attorney, Agent, or Firm* — Pergament & Cepeda LLP; Milagros A. Cepeda; Edward D. Pergament

(57) ABSTRACT

The present invention provides a field-effect transistor having an accumulation-layer-operation type field-effect transistor that includes a semiconductor layer in which a source region, a channel region, and a drain region that have either an N-type or P-type conductivity in common are formed, and a gate electrode disposed adjacent to the channel region via a gate insulating film, wherein the gate insulating film is made of a dielectric having a change gradient of a relative dielectric constant in which the relative dielectric constant changes to decrease according to the magnitude of a gate voltage applied to the gate electrode.

8 Claims, 12 Drawing Sheets

(51) Int. Cl.
| | |
|---|---|
| *H01L 29/78* | (2006.01) |
| *H01L 29/49* | (2006.01) |
| *H01L 29/786* | (2006.01) |
| *H01L 29/08* | (2006.01) |
| *H01L 29/10* | (2006.01) |
| *H01L 29/06* | (2006.01) |
| *H01L 29/16* | (2006.01) |
| *H01L 29/161* | (2006.01) |
| *H01L 29/20* | (2006.01) |

(52) U.S. Cl.
CPC ...... *H01L 29/0847* (2013.01); *H01L 29/1033* (2013.01); *H01L 29/4908* (2013.01); *H01L 29/517* (2013.01); *H01L 29/78* (2013.01); *H01L 29/78654* (2013.01); *H01L 29/78681* (2013.01); *H01L 29/78684* (2013.01); *H01L 29/78696* (2013.01); *H01L 29/0649* (2013.01); *H01L 29/0669* (2013.01); *H01L 29/16* (2013.01); *H01L 29/161* (2013.01); *H01L 29/20* (2013.01); *H01L 29/785* (2013.01); *H01L 29/7851* (2013.01)

(58) Field of Classification Search
CPC ... H01L 29/0649; H01L 29/16; H01L 29/785; H01L 29/20; H01L 29/161; H01L 29/0669; H01L 29/7851
See application file for complete search history.

(56) References Cited

U.S. PATENT DOCUMENTS

| | | |
|---|---|---|
| 6,246,076 B1 | 6/2001 | Lipkin et al. |
| 2005/0233526 A1* | 10/2005 | Watanabe ......... H01L 21/28035 438/287 |
| 2009/0250755 A1 | 10/2009 | Ohmi et al. |
| 2010/0001324 A1 | 1/2010 | Furukawa et al. |

OTHER PUBLICATIONS

Written Opinion mailed on Nov. 18, 2014, for corresponding International Patent Application No. PCT/JP2014/071254. (With English Translation).
International Preliminary Report on Patentability issued on Apr. 26, 2016, for corresponding International Patent Application No. PCT/JP2014/071254.
Taur and Ning, Fundamentals of Modern VLSI Devices, 1998, pp. 128 to 129, Cambridge University Press.
Woo Young Choi, Tunneling Field-Effect Transistors (TFETs) With Subthreshold Swing (SS) Less Than 60 mV/dec, IEEE Electron Device Letters, Aug. 2007, pp. 743 to 745, vol. 28—issue No. 8.
Extended European Search Report dated Apr. 10, 2017, for corresponding European Patent Application No. EP 14 85 4905.
Giovanni Salvatore et al., "Demonstration of a Subthreshold Swing Smaller Than 60mV/decade in Fe-FET with P(VDF-TrFe)/Sio2 Gate Stack", IEEE International Electron Devices Meeting, 2008, pp. 1-4.

* cited by examiner

FIELD-EFFECT TRANSISTOR

This application is a National Phase application under 35 U.S.C. 371 of International Application No. PCT/JP2014/071254, filed on Aug. 12, 2014, which claims priority to Japanese provisional application No. 2013-218870, filed on Oct. 22, 2013, all of which are hereby incorporated by references in their entireties.

TECHNICAL FIELD

The present invention relates to a field-effect transistor having a steep current change rate in a subthreshold region to suppress a gate voltage required to change a current value by one digit.

BACKGROUND ART

With a view to suppressing power consumption of semiconductor integrated circuits, there is a need for suppressing power consumption of individual transistors, which are the constituting elements.

As a method for achieving this object, research and development are pursued for suppressing a power required for ON-OFF switching operations of the transistors by providing a steep current change rate in a region (subthreshold region) lower than or equal to a threshold voltage that defines the switching operations. The current change rate in the subthreshold region is an index for a gate voltage (S factor) required for changing a current value by one digit. A lower current change rate enables a steeper switching operation.

However, in a typical transistor configuration, the current change rate in the subthreshold region at room temperature is higher than or equal to 60 mV/decade theoretically. Therefore, there is a problem that a steeper characteristic lower than this cannot be obtained (see, e.g., Yuan Taur and Tak H. Ning, *Fundamentals of MODERN VLSI DEVICES*, Cambridge University Press 1998, p. 128).

Hence, currently, development of a novel transistor having a steep characteristic represented by the current change rate of lower than 60 mV/decade is sought after based on a configuration different from typical transistors.

As such a novel transistor, there is proposed, for example, a tunneling field-effect transistor utilizing quantum tunneling (W. Y. Choi, et. al., *Electron Device Letters* 28 (2007), p. 743).

However, the proposed tunneling field-effect transistor has a problem of requiring a high gate voltage for its operation in order to apply a high electric field to a tunnel junction to modulate bands and induce tunneling transportation of carriers, thus failing to realize low power consumption.

Hence, currently, research and development of a novel transistor that is low power-consuming and aims to obtain a steep current change rate of lower than 60 mV/decade in the subthreshold region at room temperature are sought after from various aspects.

SUMMARY OF INVENTION

Technical Problem

The present invention aims to solve the various related problems described above and achieve an object described below. That is, the present invention has an object to provide a field-effect transistor that is low power-consuming and capable of obtaining a steep current change rate of lower than 60 mV/decade in a subthreshold region at room temperature.

To solve the problems described above, the present inventors have conducted earnest studies and obtained the following finding.

That is, the present inventors have found that an accumulation-operation-type field-effect transistor can be low power-consuming and obtain a steep current change rate of lower than 60 mV/decade in a subthreshold region at room temperature, if a gate insulating film is made of a dielectric having a change gradient of a relative dielectric constant in which the relative dielectric constant changes to decrease according to the magnitude of a gate voltage applied to a gate electrode.

This finding will be described with reference to FIG. 1. FIG. 1 is a graph plotting characteristics of transistors in which the gate insulating film is made of materials having an invariable relative dielectric constant and a transistor in which the gate insulating film is made of a dielectric having a variable relative dielectric constant. As plotted in FIG. 1, a curve a representing a current change rate (a drain current-gate voltage characteristic) of a case where the relative dielectric constant is constant at 5, a curve b representing the current change rate of a case where the relative dielectric constant is constant at 10, and a curve c representing the current change rate of a case where the relative dielectric constant is constant at 25 reveal failures to obtain a steep current change rate of lower than 60 mV/decade in the subthreshold region at room temperature, whereas a curve d representing the current change rate of the case where the relative dielectric constant changes according to an electric field intensity at the gate electrode reveals a change of the relative dielectric constant characteristic in a manner to intersect the characteristics of the cases where the relative dielectric constant is 5, 10, and 25, i.e., a success in obtaining a steep current change rate of lower than 60 mV/decade in the subthreshold region at room temperature.

Solution to Problem

The present invention is based on the finding described above, and solutions to the problems described above are as follows.

In one aspect, the present invention provides a field-effect transistor of an accumulation-layer-operation type, including:

a semiconductor layer in which a source region, a channel region, and a drain region that have either an N-type or P-type conductivity in common are formed; and a gate electrode disposed adjacent to the channel region via a gate insulating film, wherein the gate insulating film is made of a dielectric having a change gradient of a relative dielectric constant in which the relative dielectric constant changes to decrease according to a magnitude of a gate voltage applied to the gate electrode.

In one variant, the present invention provides the field-effect transistor according to the present invention, wherein when an origin is set at an electric field intensity of 0 where the electric field intensity is an intensity of an electric field applied to the dielectric, the dielectric has a local maximum value of the relative dielectric constant in a range of the electric field intensity that does not overlap the origin.

In one variant, the present invention provides the field-effect transistor according to the present invention, wherein the dielectric has the change gradient of the relative dielectric constant in which when the gate voltage is modulated by 0.5 V, the relative dielectric constant becomes lower than or equal to a 0.5-times multiple of the relative dielectric constant before modulation.

In one variant, the present invention provides the field-effect transistor according to the present invention, wherein the dielectric is constituted by any one of: a superlattice structure formed by laminating layers of a metal oxide having a perovskite-type crystalline structure, a metal oxide having a fluorite-type crystalline structure, and a metal oxide having the perovskite-type crystalline structure of a different kind; a superlattice structure formed by laminating layers of metal oxides having the fluorite-type crystalline structure of different kinds; and a superlattice structure formed by laminating layers of a metal oxide having the perovskite-type crystalline structure and a metal oxide having the fluorite-type crystalline structure.

In one variant, the present invention provides the field-effect transistor according to the present invention, wherein the semiconductor layer has a thickness of from 6 nm through 10 nm.

In one variant, the present invention provides the field-effect transistor according to the present invention, wherein an impurity concentration in the channel region is from $4\times10^{18}/cm^3$ through $7\times10^{18}/cm^3$.

In another variant, the present invention provides the field-effect transistor according to the present invention, further including:

an interfacial layer disposed between the channel region and the gate insulating film.

In another variant, the present invention provides the field-effect transistor according to the present invention, wherein a material of which the semiconductor layer is made is any one of silicon, germanium, tin, a mixed crystal of silicon and germanium, a mixed crystal of germanium and tin, and a group III-V compound.

In another variant, the present invention provides the field-effect transistor according to the present invention, wherein the field-effect transistor has a transistor structure of any one of a bulk type, a SOI type, a fin type, and a nanowire type.

Advantageous Effects of Invention

The present invention can solve the various related problems described above and provide a field-effect transistor that is low power-consuming and capable of obtaining a steep current change rate of lower than 60 mV/decade in a subthreshold region at room temperature.

DESCRIPTION OF EMBODIMENTS

Figure 2:
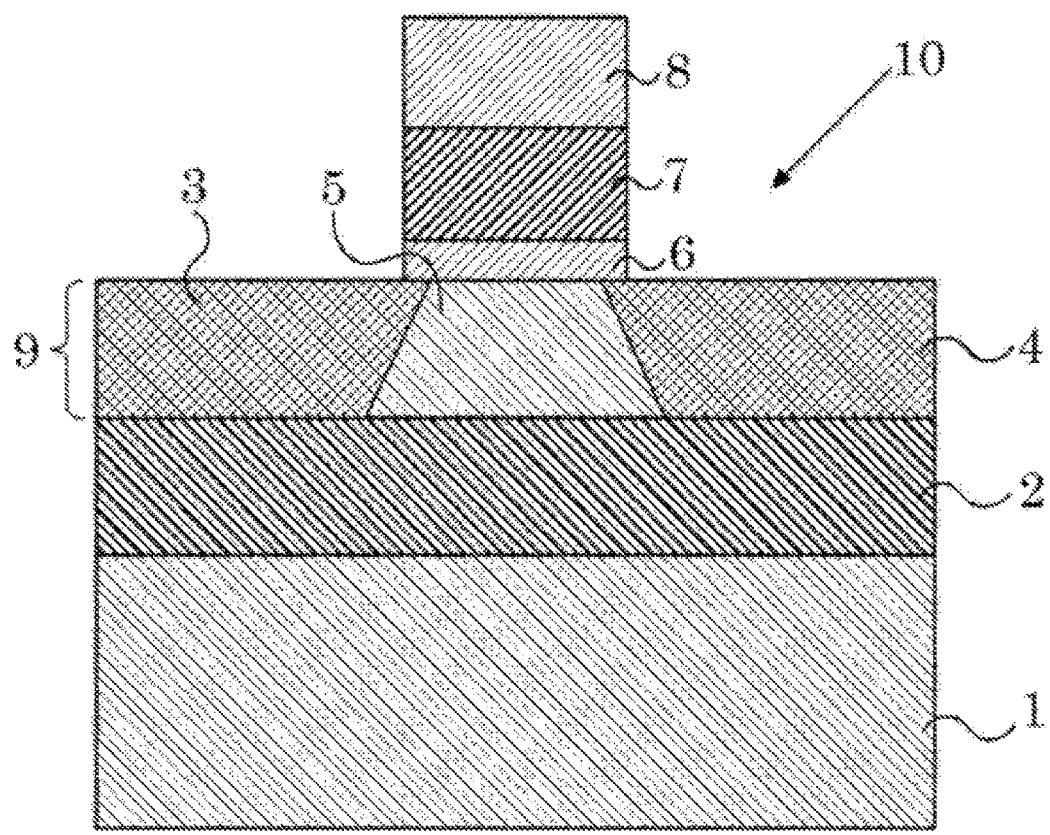
FIG. 2 is a depictive diagram illustrating a cross-sectional structure of a field-effect transistor according to an embodiment of the present invention.

A field-effect transistor of the present invention will be described with reference to mainly FIG. 2. FIG. 2 is a depictive diagram illustrating a cross-sectional structure of a field-effect transistor according to an embodiment of the present invention. As illustrated in FIG. 2, a field-effect transistor 10 includes a support substrate 1, an insulating layer 2, a source region 3, a drain region 4, a channel region 5, an interfacial layer 6, a gate insulating film 7, and a gate electrode 8.

The support substrate 1 is not particularly limited, and an arbitrary support substrate may be selected according to the purpose. For example, the support substrate in a known SOI (Silicon on Insulator) substrate may be used.

The insulating layer 2 is disposed over the support substrate 1. The insulating layer 2 is not particularly limited, and an arbitrary insulating layer may be selected according to the purpose. For example, the embedded oxide film in the SOI substrate may be used.

A semiconductor layer 9 in which the source region 3, the drain region 4, and the channel region 5 are formed is disposed over insulating layer 2. The semiconductor layer 9 is not particularly limited, and an arbitrary semiconductor layer may be selected according to the purpose. For example, the semiconductor layer in the SOI substrate may be used. That is, it is possible to constitute the support substrate 1, the insulating layer 2, and the semiconductor layer 9 by using the SOI substrate.

Although the SOI substrate is raised as an example, a semiconductor material for forming the semiconductor layer 9 is not particularly limited, and a semiconductor material other than silicon may be selected where appropriate. For example, germanium, tin, a mixed crystal of silicon and germanium, a mixed crystal of germanium and tin, and a group III-V compound such as $In_xGa_{1-x}As$ (where x is greater than or equal to 0.53) and GaSb may be used.

A thickness of the semiconductor layer 9 is not particularly limited, but is preferably from 6 nm through 10 nm from a viewpoint of obtaining a steep current change rate of lower than 60 mV/decade in the subthreshold region at room temperature.

The source region 3 and the drain region 4 are formed by ion implantation of an impurity substance into the semiconductor layer 9. The impurity substance is not particularly limited so long as the impurity substance is a material that generates carriers. Examples of the impurity substance when the source region 3 and the drain region 4 are formed to have an N-type conductivity include P and As. Examples of the impurity substance when the source region 3 and the drain region 4 are formed to have a P-type conductivity include B. A method for ion implantation is not particularly limited, and may be carried out according to a known ion implantation method. For example, the method may be carried out by performing ion implantation into the semiconductor layer 9 with a known ion implantation apparatus using a material gas such as a boron difluoride ($BF_2$) gas, a phosphine ($PH_3$) gas, and an arsine ($AsH_3$) gas or a solid of a material such as solid P and solid As as an ion source.

The source region 3 and the drain region 4 formed to have the same conductivity type. A concentration of the impurity substance in the source region 3 and the drain region 4 is not particularly limited, but is preferably from $1\times10^{19}/cm^3$ through $1\times10^{21}/cm^3$ in order to suppress a parasitic resistance.

The channel region 5 is disposed between the source region 3 and the drain region 4 and formed to have the same conductivity type as the source region 3 and the drain region 4 to form an accumulation-operation-type transistor.

The channel region 5 is not particularly limited, and may be formed according to the same method as the method for forming the source region 3 and the drain region 4. However, the impurity concentration in the channel region 5 is preferably from $4\times10^{18}/cm^3$ through $7\times10^{18}/cm^3$ from a viewpoint of obtaining a steep current change rate of lower than 60 mV/decade in the subthreshold region at room temperature.

As described above, the source region 3, the channel region 5, and the drain region 4 that have either an N-type or P-type conductivity in common are formed in the semiconductor layer 9, which enables an accumulation-layer-type transistor operation. That is, when a predetermined gate voltage is set to the gate electrode 8, a field effect generated due to an electric potential difference between the gate electrode 8 and the channel region 5 causes the channel region 5 to be depleted to block a drain current between the source region 3 and the drain region 4 (OFF state). When a different gate voltage is applied to the gate electrode 8, the depletion of the channel region 5 shrinks to promote an accumulation layer in which the same carriers as those in the source region 3 and the drain region 4 are accumulated to be formed in the channel region 5, which causes a drain current to flow between the source region 3 and the drain region 4 through the accumulation layer (ON state).

Incidentally, transistors of the accumulation-operation type are typically normally-on types in which a current flows even when no gate voltage is applied. However, transistors preferable for use in low-power-consuming integrated circuits are normally-off types. Hence, the field-effect transistor 10 is an accumulation-operation-type transistor of a normally-off type.

It is possible to make the field-effect transistor 10 operate as a normally-off type, by adjusting a metal material (work function) of the gate electrode 8 and a thickness of the channel region 5 (semiconductor layer 9) according to a known example to thereby set a threshold voltage defining ON-OFF operations to a predetermined value. That is, based on the setting of the threshold voltage, the field-effect transistor 10 switches off when the channel region 5 is depleted to offset an electric field that is generated due to an electric potential difference between the gate electrode 8 and the channel region 5 even when no gate voltage is applied, and switches on when the depletion shrinks upon application of a gate voltage in a positive direction to weaken the electric field.

Figure 3:
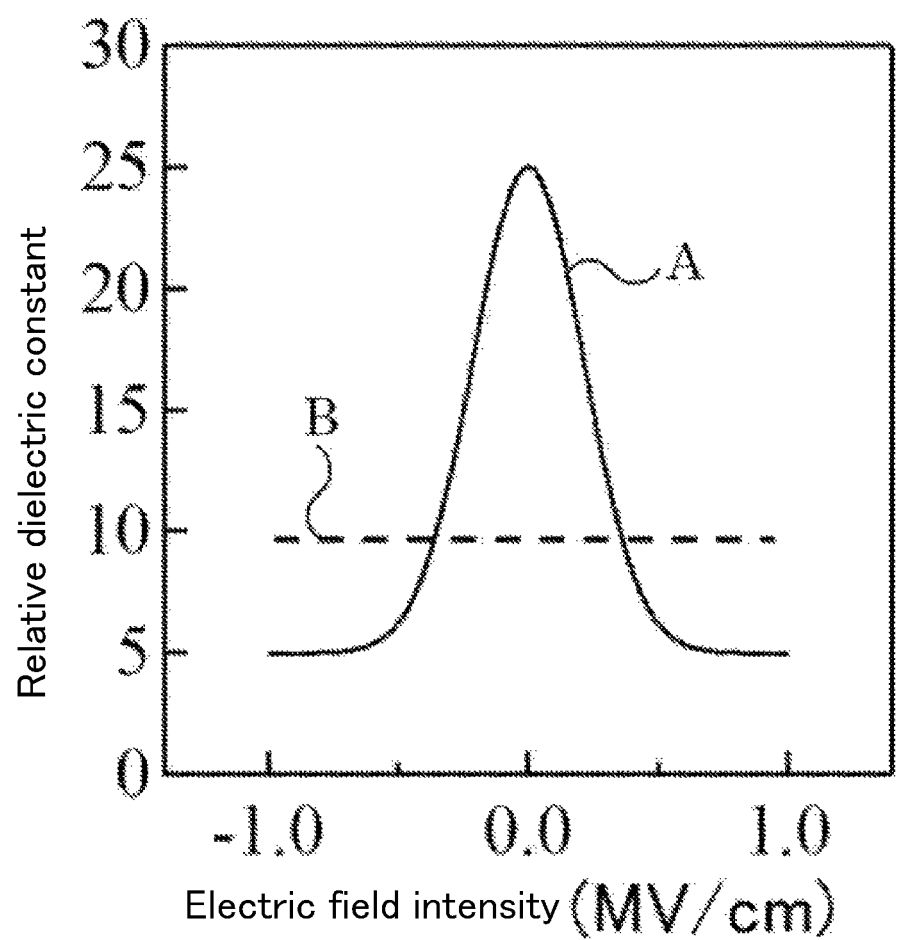
FIG. 3 is a graph plotting electric field intensity-dielectric constant characteristics of dielectrics.

The gate insulating film 7 is disposed over the channel region 5 and made of a dielectric having a change gradient of a relative dielectric constant in which the relative dielectric constant changes to decrease according to the magnitude of the gate voltage applied to the gate electrode 8. A characteristic of the dielectric will be described with reference to FIG. 3. FIG. 3 is a graph plotting electric field intensity-dielectric constant characteristics of dielectrics.

Typically, dielectrics include dielectrics that have a characteristic exemplified by a sign A in FIG. 3, i.e., a relative dielectric constant that changes in response to changes in electric field intensity (here, such dielectrics will be referred to as nonlinearly responding dielectric), and dielectrics that have a characteristic exemplified by a sign B, i.e., a relative dielectric constant that does not change in response to changes in electric field intensity (here, such dielectrics will be referred to as linearly responding dielectric). Representative examples of the linearly responding dielectric include $SiO_2$, which is widely used as a gate insulating film of field-effect transistors of the accumulation-operation type and field-effect transistors of an inversion-operation type. In contrast, the field-effect transistor 10 uses the nonlinearly responding dielectric as a material for forming the gate insulating film 7 to utilize the change gradient of the relative dielectric constant in which the relative dielectric constant changes to decrease according to the magnitude of the gate voltage applied to the gate electrode 8 to obtain a steep current change rate of lower than 60 mV/decade in the subthreshold region at room temperature.

The field-effect transistor 10 using the nonlinearly responding dielectric having the relative dielectric constant that changes according to the magnitude of the gate voltage is operated based on a setting of the gate voltage within a range in which the change gradient of the relative dielectric constant in which the relative dielectric constant changes to decrease is used wholly or partially.

In regard to FIG. 3, the relative dielectric constant of the nonlinearly responding dielectric having the characteristic exemplified by the sign A changes according to the electric field intensity. The field-effect transistor 10 utilizes the effect of the relative dielectric constant's changing to decrease in response to a change of the electric field intensity at the nonlinearly responding dielectric upon increase of the gate voltage in the operation range of the gate voltage.

Figure 4:
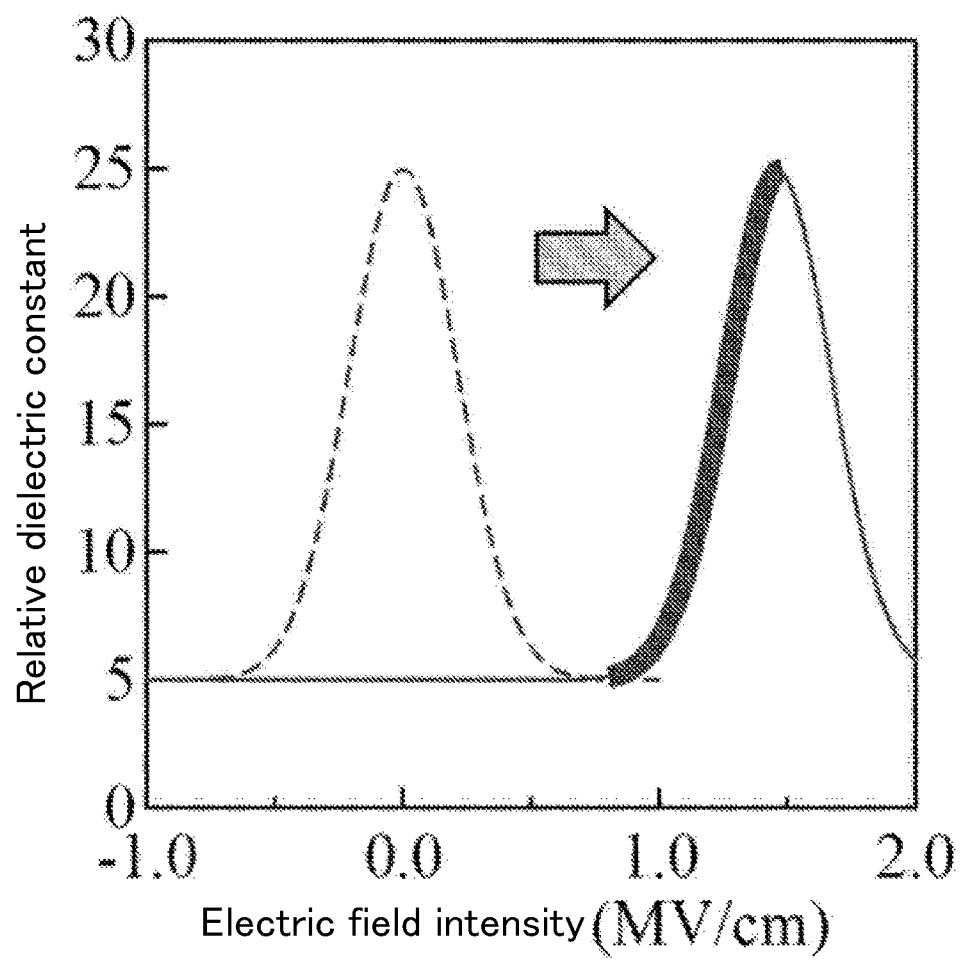
FIG. 4 is a graph plotting an electric field intensity-dielectric constant characteristic of a nonlinearly responding dielectric.

It is preferable that when an origin is set at an applied electric field intensity of 0, the nonlinearly responding dielectric have a local maximum value of the relative dielectric constant in a range of the electric field intensity that does not overlap the origin. This characteristic of the nonlinearly responding dielectric will be described with reference to FIG. 4. FIG. 4 is a graph plotting an electric field intensity-dielectric constant characteristic of the nonlinearly responding dielectric.

As plotted in FIG. 4, a characteristic that the nonlinearly responding dielectric should preferably have is a characteristic represented by a curve that is convex upward and has a local maximum value of the relative dielectric constant in a range of the electric field intensity that does not overlap the origin.

In the accumulation-operation-type field-effect transistor 10, the nonlinearly responding dielectric may be under an electric field having a high intensity due to a field effect attributed to the aforementioned electric potential difference even in an OFF state in which no gate voltage is applied to the gate electrode 8. Hence, it is preferable to use the nonlinearly responding dielectric having a local maximum value of the relative dielectric constant in a range of the electric field intensity that does not overlap the origin.

From a viewpoint of obtaining a steep current change rate of lower than 60 mV/decade in the subthreshold region at room temperature, it is preferable that the change gradient of the relative dielectric constant be steep in the field-effect transistor 10 utilizing the change gradient of the relative dielectric constant. Specifically, it is preferable that the nonlinearly responding dielectric have a change gradient of the relative dielectric constant in which when the gate voltage is modulated to a value higher by 0.5 V on an absolute value basis, the relative dielectric constant becomes lower than or equal to a 0.5-times multiple of the relative dielectric constant before modulation.

The nonlinearly responding dielectric is not particularly limited, and it is preferable that the nonlinearly responding dielectric be constituted by any one of: a superlattice structure formed by laminating layers of a metal oxide having a perovskite-type crystalline structure, a metal oxide having a fluorite-type crystalline structure, and a metal oxide having the perovskite-type crystalline structure of a different kind; a superlattice structure formed by laminating layers of metal oxides having the fluorite-type crystalline structure of different kinds; and a superlattice structure formed by laminating layers of a metal oxide having the perovskite-type crystalline structure and a metal oxide having the fluorite-type crystalline structure, which are examples of dielectrics having the characteristic described above.

Examples of the metal oxide having the perovskite-type crystalline structure include $CaTiO_3$, $SrTiO_3$, $BaTiO_3$, $CaZrO_3$, $SrZrO_3$, $BaZrO_3$, $CaHfO_3$, $SrHfO_3$, $BaHfO_3$, $PbTiO_3$, $(Ba, Sr)TiO_3$, $Pb(Zr, Ti)O_3$, $SrBi_2Ta_2O_9$, $SrBi_2Nb_2O_9$, and $Sr_2Bi_4Ti_5O_{18}$.

Examples of the metal oxide having the fluorite-type crystalline structure include $ZrO_2$, $ZrO_2$ in which Y is added in an amount of from 9 mol % through 13 mol %, $HfO_2$, $HfO_2$ in which Y is added in an amount of from 9 mol % through 13 mol %, $HfO_2$ in which La is added in an amount of from 9 mol % through 13 mol %, and $(Zr, Hf)O_2$.

Examples of the superlattice structure include a laminated structure of $SrTiO_3$ and $BaTiO_3$, a laminated structure of $SrZrO_3$ and $BaZrO_3$, a laminated structure of $SrHfO_3$ and $BaHfO_3$, a laminated structure of $ZrO_2$ and $HfO_2$, a laminates structure of $SrHfO_3$ and $HfO_2$, and a laminated structure of $SrZrO_3$ and $ZrO_2$.

Figure 5A:
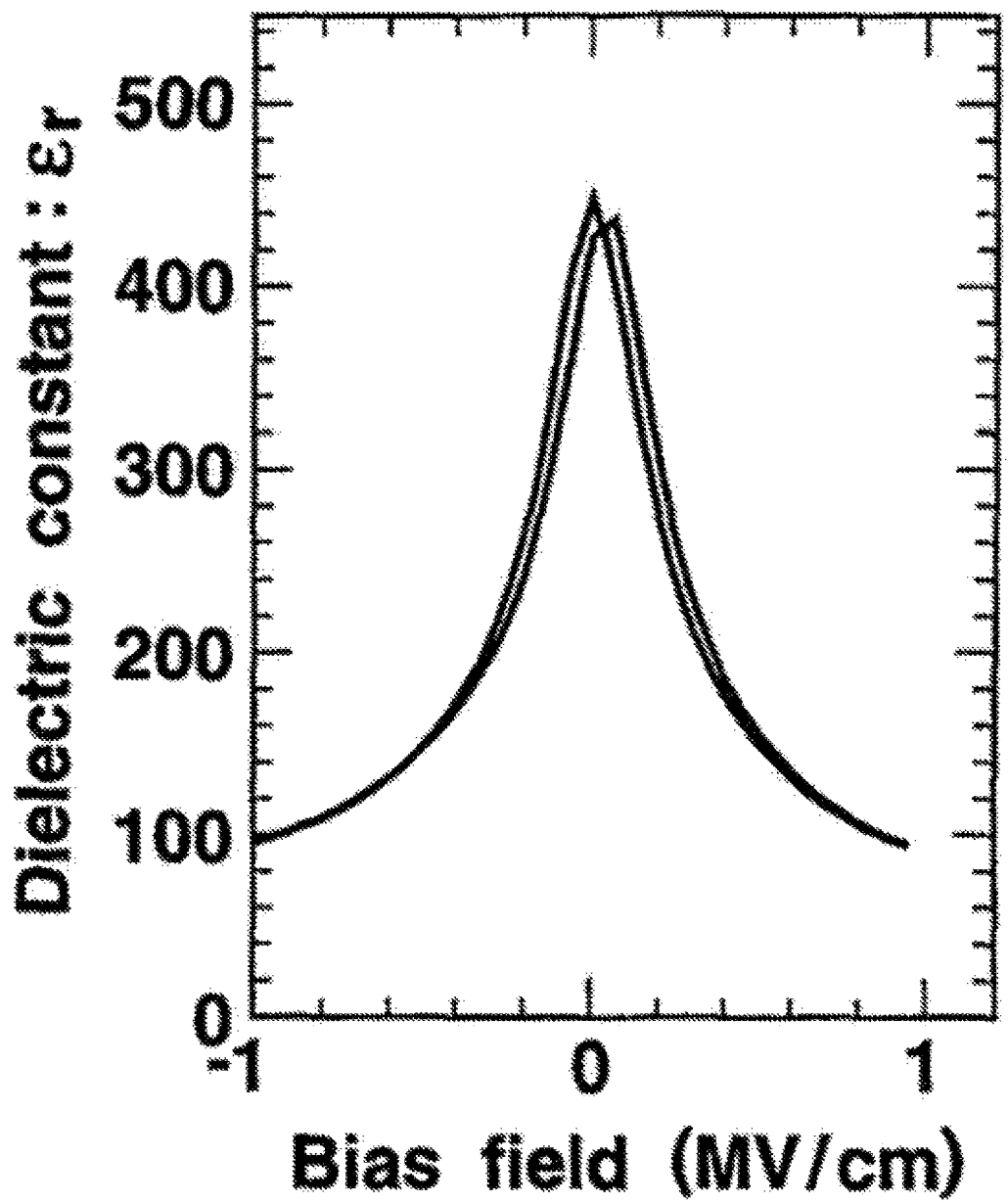
FIG. 5A is a graph plotting an example of electric field dependency of a relative dielectric constant of $SrTiO_3$ having a perovskite-type crystalline structure.
Figure 5B:
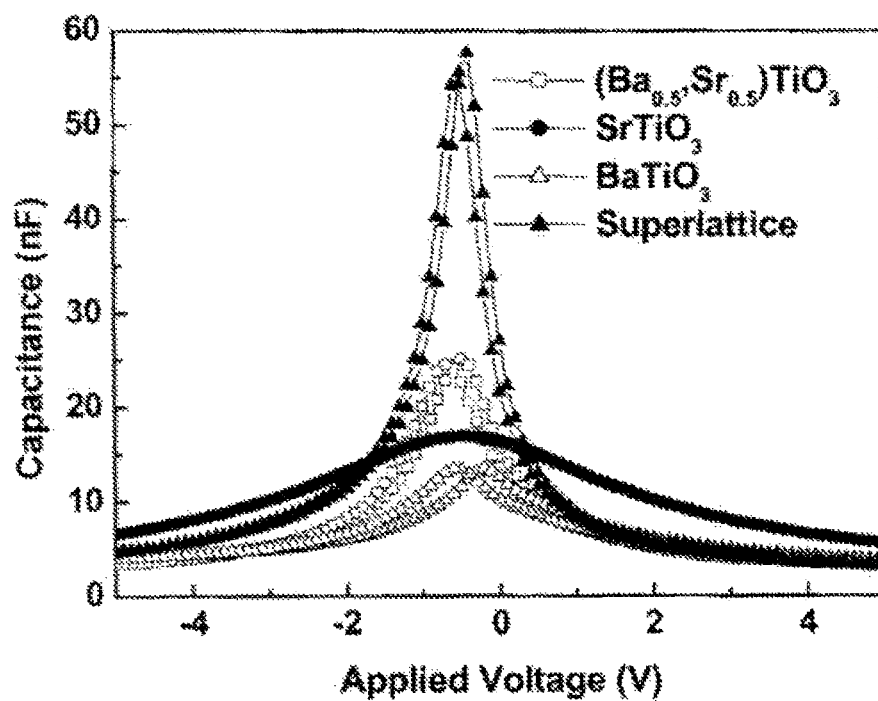
FIG. 5B is a graph plotting an example of electric field (voltage) dependency of a relative dielectric constant (capacitance) of a dielectric having a superlattice structure.

Various reports have been raised as examples of the nonlinearly responding dielectric. The nonlinearly responding dielectric may be formed according to such known examples. As specific examples of the known examples, a reported example of $SrTiO_3$ having the perovskite-type crystalline structure (Referential Document 1) and a reported example of the superlattice structure (Referential Document 2) are plotted d in FIG. 5A and FIG. 5B. These graphs both plot electric field dependency of the relative dielectric constant of the nonlinearly responding dielectric.

A thickness of the gate insulating film 7 made of the nonlinearly responding dielectric is not particularly limited. However, from a viewpoint of obtaining a steep current change rate of lower than 60 mV/decade in the subthreshold region at room temperature, it is preferable that an effective oxide film thickness (EOT; Equivalent Oxide Thickness) of the gate insulating film 7 have a change rate ($EOT_{max}/EOT_{min}$) of greater than or equal to 2 when the gate voltage is modulated by 0.5 V. $EOT_{max}$ represents EOT after the gate voltage is modulated, and $EOT_{min}$ represents EOT before the gate voltage is modulated.

Referential Document 1: S. Komatsu et al., Jpn. J. Appl. Phys. vol. 37 (1998) p. 5651.

Referential Document 2: J. Kim et al., Appl. Phys. Lett. vol. 80 (2002) p. 3581.

The gate electrode 8 is disposed over the gate insulating film 7. A material for forming the gate electrode 8 is not particularly limited, and examples of the material include Al, Au, Pt, W, TaN, TiN, and silicide. A method for forming the gate electrode 8 is not particularly limited, and examples of the method include a sputtering method and a CVD (Chemical Vapor Deposition) method. A thickness of the gate electrode 8 is not particularly limited and may be from about 10 nm through 50 nm.

The interfacial layer 6 is disposed between the channel region 5 and the gate insulating film 7. The interfacial layer 6 has a function for suppressing interdiffusion of the constituent atoms of the gate insulating film 7 and the channel region 5 between each other, and is disposed as needed depending on the construction of the gate insulating film 7 and the channel region 5.

A material for forming the interfacial layer 6 is not particularly limited, and examples of the material include $HfO_2$, $ZrO_2$, $Al_2O_3$, SiN, and InP. A method for forming the interfacial layer 6 is not particularly limited, and examples of the method include a sputtering method and a CVD method.

In disposing the interfacial layer 6, it is more preferable if a thickness of the interfacial layer 6 is smaller and preferably smaller than or equal to, for example, 5 nm. In disposing the interfacial layer 6, the EOT of the gate insulating film 7 is set to include an EOT of the interfacial layer 6.

An operation of the accumulation-operation-type field-effect transistor 10 having the configuration described above will be described.

First, the gate voltage of the gate electrode 8 is set to 0 or a small value. At the time, the gate insulating film 7 is under an electric field having a high intensity due to an electric potential difference between the gate electrode 8 and the channel region 5 and in a state of having a high relative dielectric constant according to the characteristic of the nonlinearly responding dielectric plotted in FIG. 4. When a strong electric field that balances with the electric field at the gate insulating film 7 is also applied to the channel region 5 in this state, the channel region 5 is depleted to strongly block a drain current between the source region 3 and the drain region 4 (OFF state).

Next, a gate voltage higher than that in the OFF state is applied to the gate electrode 8. At the time, as the gate voltage increases, the electric field intensity at the gate insulating film 7 weakens to cause a decreasing change of the relative dielectric constant according to the characteristic of the nonlinearly responding dielectric. In response to this decreasing change, carriers are gradually accumulated in the depleted region in the channel region 5 to form an accumulation layer, which causes a drain current to flow between the source region 3 and the drain region 4 through the accumulation layer in the channel region 5 (ON state).

At the time, a steep current change rate during the shift from the OFF state to the ON state of lower than 60 mV/decade can be obtained in the subthreshold region at room temperature.

Further, the operation range of the gate voltage for ON/OFF switching can be defined by low voltages.

A configuration of an inversion-operation-type field-effect transistor obtained by forming a gate insulating film with a ferroelectric having a dielectric constant that changes according to an electric field intensity is known to be used for a memory operation purpose. However, there has been no report that a steep current change rate of lower than 60 mV/decade is obtained when a field-effect transistor intended for use as a switching operation purpose is constituted based on the configuration of this inversion-operation-type field-effect transistor. The reason for this is not necessarily certain. However, as a result of a computational study of the present inventors', the reason is inferred to be that in the case of the inversion layer operation, a saddle point at which the drain current becomes constant and the nonlinearly responding dielectric does not function as the gate insulating film is present in the subthreshold region, which inhibits steepening of the current change rate.

This will be described by taking the characteristics plotted in FIG. 1 and FIG. 4 for example. When the gate voltage is low (−0.1 V, see the curve d in FIG. 1), the electric field intensity at the gate insulating film 7 is high (1.5 MV/cm, see FIG. 4) and the relative dielectric constant of the gate insulating film 7 takes a local maximum value (relative dielectric constant: 25, see FIG. 4).

Figure 1:
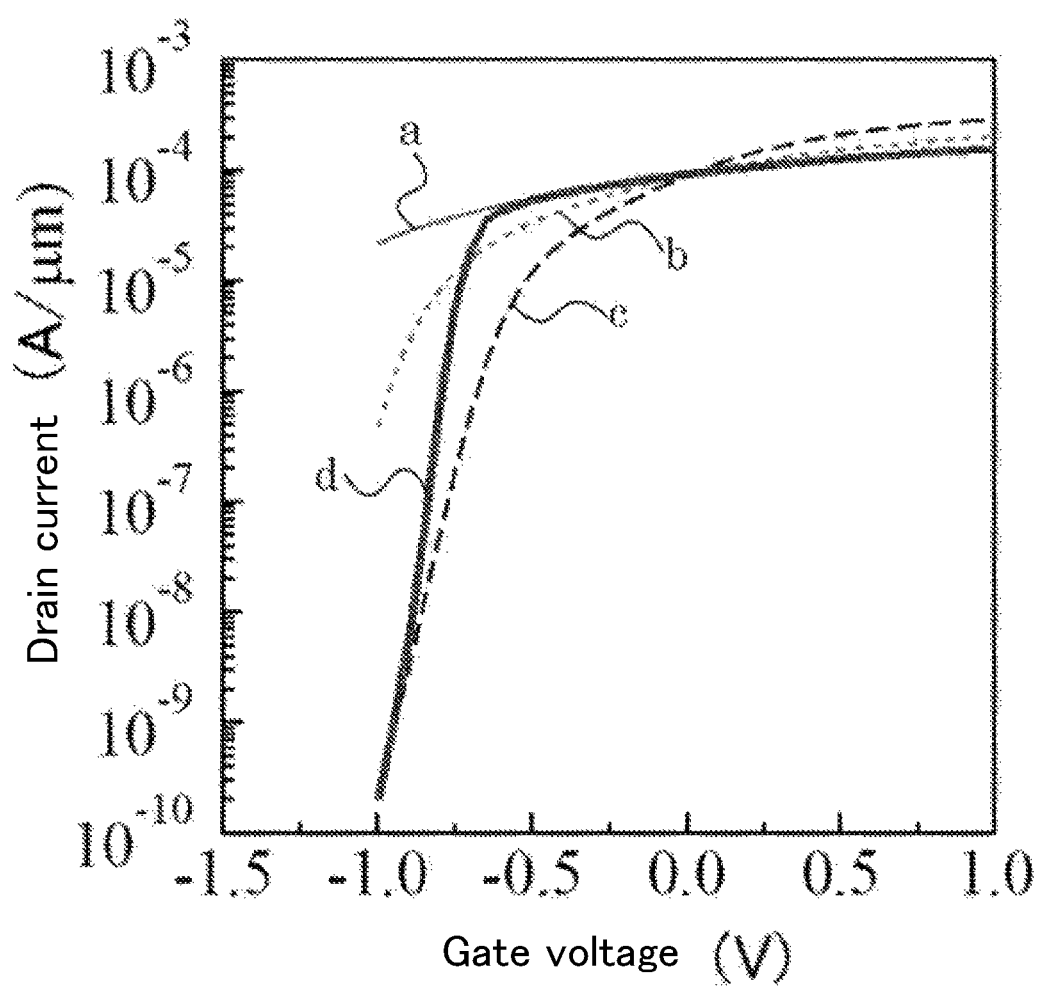
FIG. 1 is a graph plotting characteristics of transistors in which a gate insulating film is made of materials having an invariable relative dielectric constant and a transistor in which a gate insulating film is made of a dielectric having a variable relative dielectric constant.

As the gate voltage increases from this state (1.0 V, see the curve d in FIG. 1), the electric field intensity at the gate insulating film 7 weakens (1.0 MV/cm, see FIG. 4), the relative dielectric constant of the gate insulating film 7 decreases (relative dielectric constant: 5, see FIG. 4), and a steep rise of the drain current is realized (see the curve d in FIG. 1).

In this example, a case of a so-called N-type transistor where the gate voltage is changed in the positive direction has been described. However, the field-effect transistor of the present invention can also be applied as a so-called P-type transistor that is operated by changing the gate voltage in the negative direction. That is, also in this case, the relative dielectric constant of the gate insulating film 7 and the electric field intensity change in the same way as when the gate voltage is changed in the positive direction. Therefore, a field-effect transistor utilizing this characteristic can be obtained.

An embodiment of the present invention has been described by raising as an example, the field-effect transistor 10 having the configuration represented by a SOI-type field-effect transistor obtained by disposing the gate insulating film 7 and the gate electrode 8 in this order over the channel region 5 in the semiconductor layer 9. However, the transistor configuration utilizing the characteristic of the nonlinearly responding dielectric of which the gate insulating film 7 is made is not limited to the SOI type. The field-effect transistor of the present invention may be constructed as known transistor configurations such as a bulk type that utilizes a flat surface of a crystalline substrate as a channel, a fin type in which one surface and another surface of a channel region are covered with a gate insulating film and a gate electrode that are formed in a squared-U shape, and a nanowire type in which the circumference of a cylindrical channel region is covered with a gate insulating film and a gate electrode.

Figure 6:
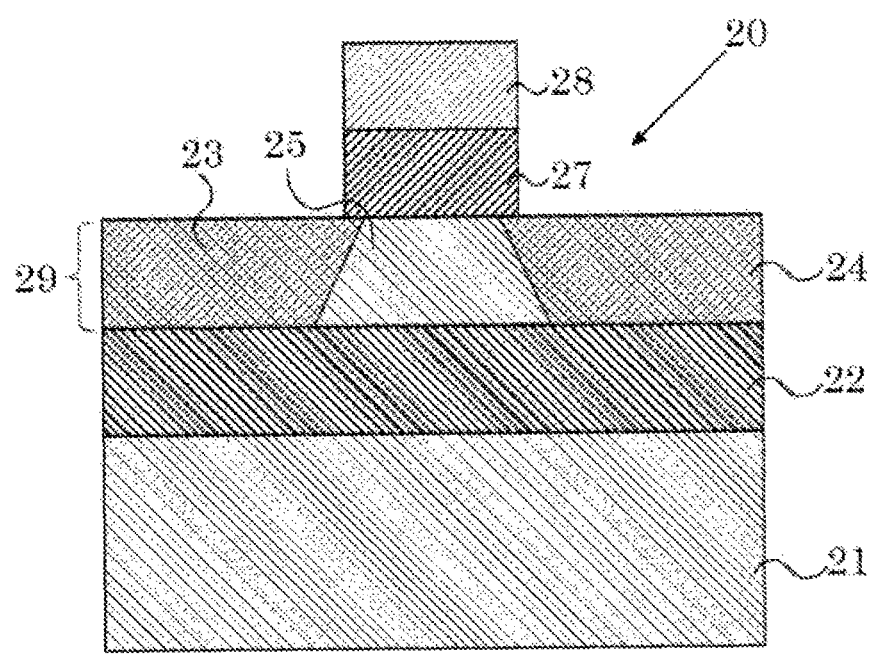
FIG. 6 is a depictive diagram illustrating a cross-sectional structure of a field-effect transistor, which is a target of a simulation test.

A simulation test was conducted for confirming the operation of the field-effect transistor described above. The simulation test was conducted by assuming a field-effect transistor 20 illustrated in FIG. 6. FIG. 6 is a depictive diagram illustrating a cross-sectional structure of the field-effect transistor 20, which is the target of the simulation test.

The field-effect transistor 20 includes a SOI substrate obtained by laminating, in an order of reciting, an insulating layer 22 and a semiconductor layer 29 in which a source region 23, a drain region 24, and a channel region 25 are formed over a support substrate 21, a gate insulating film 27 disposed over the channel region 25, and a gate electrode 28 disposed over the gate insulating film 27.

Details of the members will be described. A thickness of a semiconductor layer 29 was 8 nm. An impurity introduced into the source region 23 and the drain region 24 by ion implantation was As, and the impurity concentration was $1 \times 10^{20}/cm^3$. An impurity introduced into the channel region 25 by ion implantation was As, and the impurity concentration was $5 \times 10^{18}/cm^3$. A relative dielectric constant of the gate insulating film 27 made of the nonlinearly responding dielectric was variable in a range of from 25 through 5. A work function of the gate electrode 28 was 5.0 eV.

In the simulation test, a drain current when the gate voltage was applied to the gate electrode 28 of the field-effect transistor 20 while a source electrode was maintained at 0 V and a drain electrode was maintained at 0.1 V was calculated. A simulator used for the calculation was HYENEXX ver. 5.5 developed by Selete, Inc.

Figure 7:
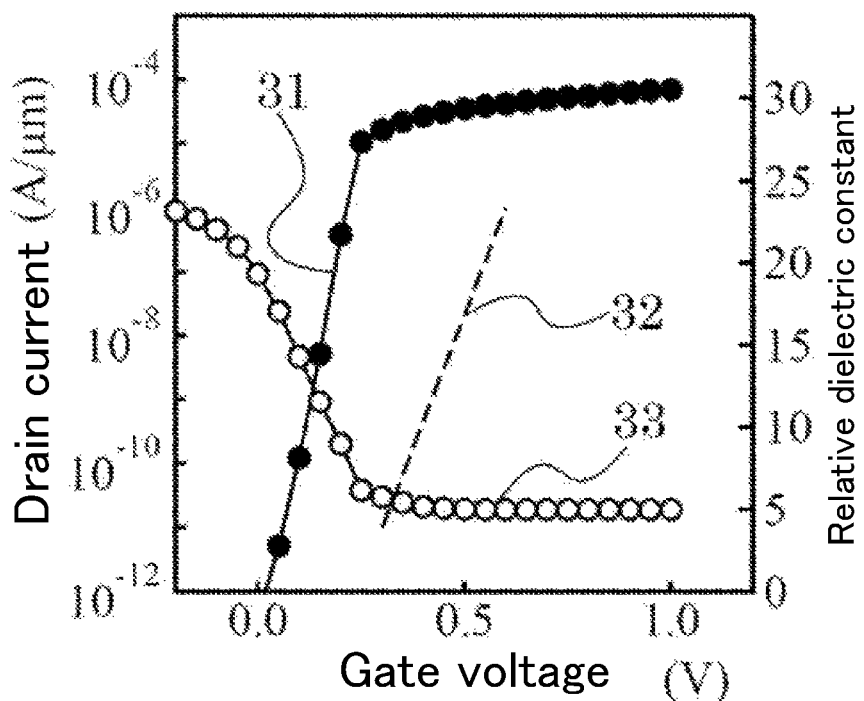
FIG. 7 is a graph plotting a gate voltage-drain current characteristic of a field-effect transistor.

The result of the simulation is plotted in FIG. 7. FIG. 7 is a graph plotting a gate voltage-drain current characteristic of the field-effect transistor 20. In FIG. 7, the reference sign 31 denotes the gate voltage-drain current characteristic of the field-effect transistor, and the reference sign 32 denotes a drain current rising characteristic in which the current change rate in the subthreshold region at room temperature was 60 mV/decade, which is considered to be the theoretical limit in existing field-effect transistors. The reference sign 33 denotes a gate voltage-relative dielectric constant characteristic of the field-effect transistor, and the characteristic has a change gradient in which the relative dielectric constant of the gate insulating film 27 changes to decrease as the gate voltage increases.

As plotted in FIG. 7, the gate voltage-drain current characteristic of the field-effect transistor 20 exhibits a steeper rise of the drain current than that in the gate voltage-drain current characteristic of the field-effect transistor, with a current change rate in the subthreshold region at room temperature of 48 mV/decade.

The change of the relative dielectric constant of the gate insulating film 27 relative to the gate voltage, which was used for the calculation of the simulation test, will be described. As indicted by a formula (1) below, there is a relationship that the EOT of the gate insulating film 27 made of the nonlinearly responding dielectric is the minimum when the relative dielectric constant is the maximum, whereas the EOT is the maximum when the relative dielectric constant is the minimum. The change of the EOT of the gate insulating film 27 relative to the gate voltage is plotted in FIG. 8. In the simulation test, the calculation was performed using this EOT change characteristic.

$$EOT = \epsilon_{SiO_2} x / \epsilon \quad (1)$$

In the formula (1) above, T represents a physical film thickness of the gate insulating film 27, ∈ represents the dielectric constant of the gate insulating film, and $\in_{SiO_1}$ represents a dielectric constant of $SiO_2$.

As described above, a drain current rising characteristic that was steeper than the current change rate in the sub-threshold region at room temperature of 60 mV/decade, which is the theoretical limit in existing field-effect transistors, was obtained in the simulation test.

Further, the result of a consideration about conditions for obtaining a steep drain current rising characteristic will be described below.

First, a case where the EOT changing characteristic was varied will be described. From a viewpoint of obtaining a steep drain current rise, it is necessary that the relative dielectric constant largely change when the gate voltage is modulated by 0.5 V.

Figure 8:
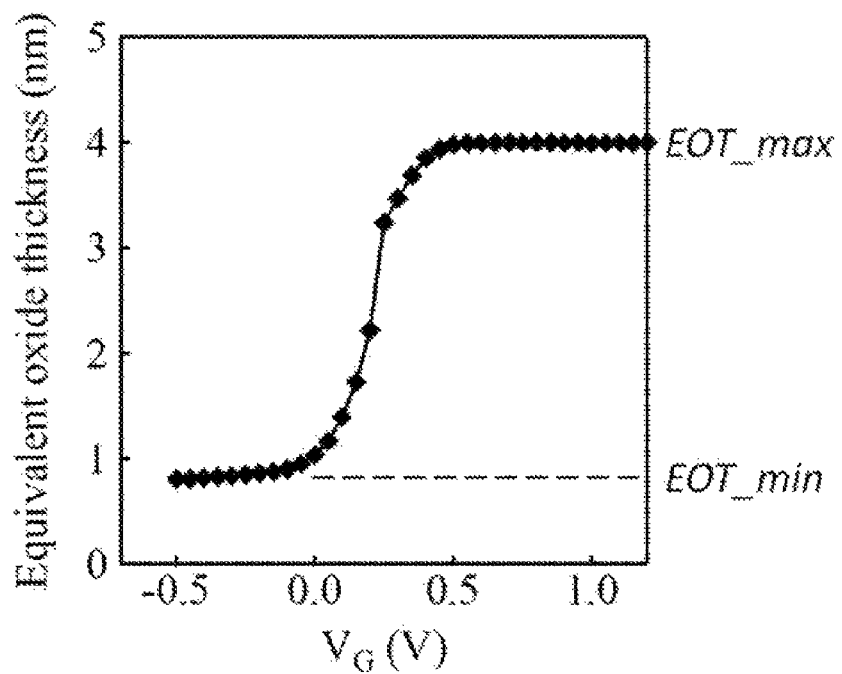
FIG. 8 is a graph plotting EOT change of a gate insulating film relative to a gate voltage.

Here, a relative dielectric constant changing condition effective for obtaining a steep drain current rise was considered based on an EOT change rate ($EOT_{max}/EOT_{min}$) of the EOT change plotted in the aforementioned FIG. 8 per 0.5 V modulation of the gate voltage.

Figure 9:
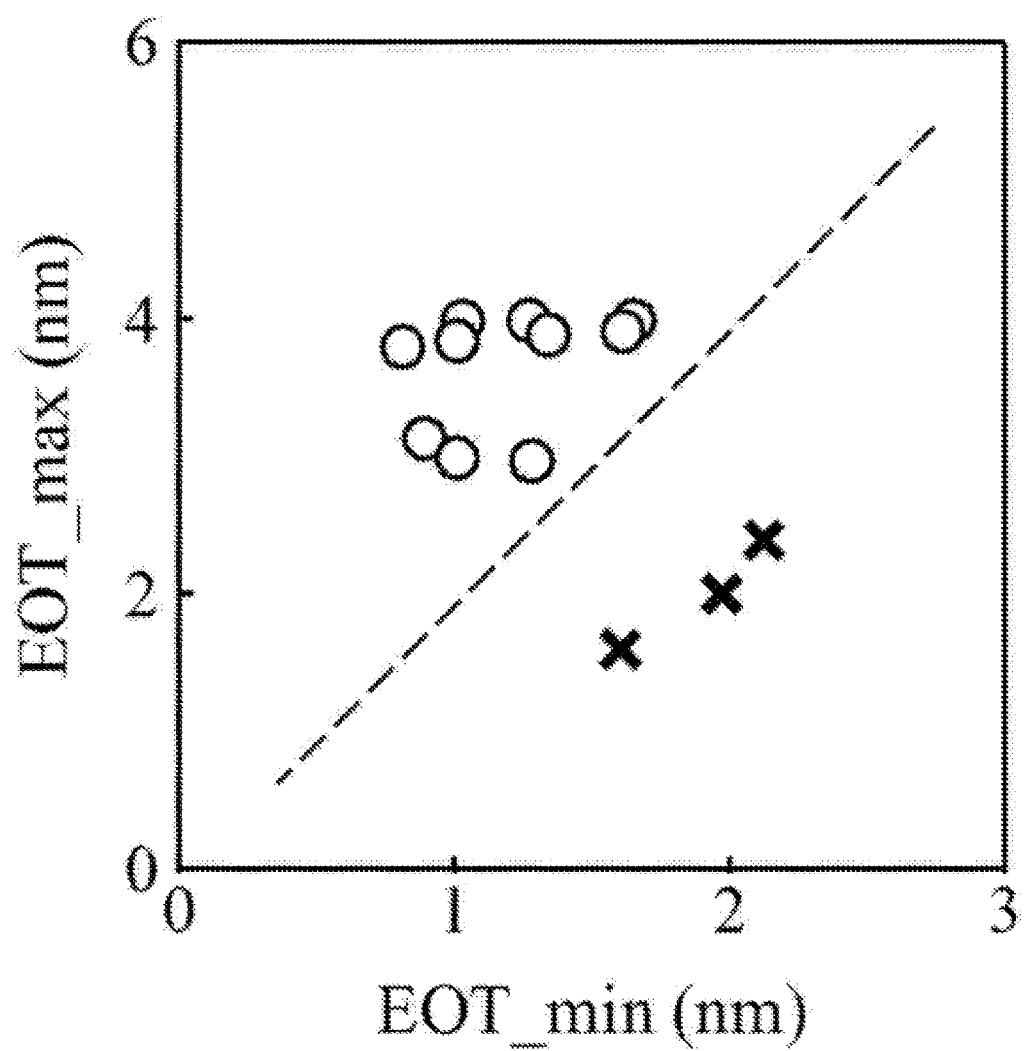
FIG. 9 is a graph plotting EOT change rate characteristics when a gate voltage is modulated by 0.5 V.

FIG. 9 plots EOT change rate characteristics when the gate voltage is modulated by 0.5 V. In FIG. 9, the circle marks denote a case where the current change rate was lower than 60 mV/decade, and the cross marks denote a case where the current change rate was higher than or equal to 60 mV/decade. $EOT_{max}$ represents EOT after the gate voltage was modulated, and $EOT_{min}$ represents EOT before the gate voltage was modulated.

As plotted in FIG. 9, steep current rising characteristics in which the current change rate was lower than 60 mV/decade were obtained when the EOT change rate ($EOT_{max}/EOT_{min}$) per 0.5 V modulation of the gate voltage was greater than or equal to 2. This means that the gate insulating film 27 had a change gradient of the relative dielectric constant in which when the gate voltage was modulated by 0.5 V, the relative dielectric constant became lower than or equal to a 0.5-times multiple of the relative dielectric constant before the gate voltage was modulated.

Next, a relationship between the thickness of the channel region 25 in the semiconductor layer 29 and the current change rate will be described.

Figure 10:
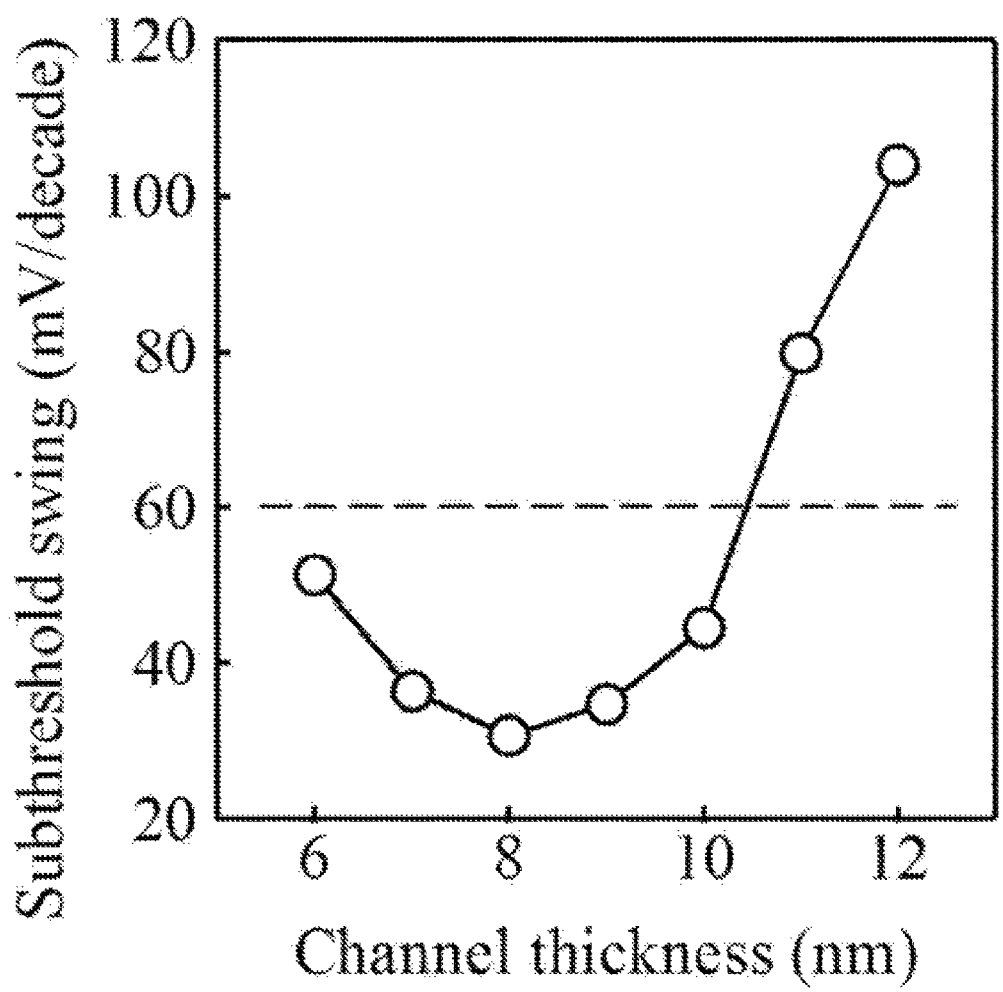
FIG. 10 is a graph plotting a result of calculation of a current change rate (Subthreshold swing) when a thickness of a channel region is varied.

FIG. 10 plots a result of calculation of the current change rate (Subthreshold swing) when the thickness of the channel region 25 was varied in the simulation test described above.

As plotted in FIG. 10, it is seen that a steep current rising characteristic in which the current change rate was lower than 60 mV/decade was obtained when the thickness of the channel region 25 was from 6 nm through 10 nm.

Next, a relationship between the impurity concentration in the channel region 25 in the semiconductor layer 29 and the current change rate will be described.

Figure 11:
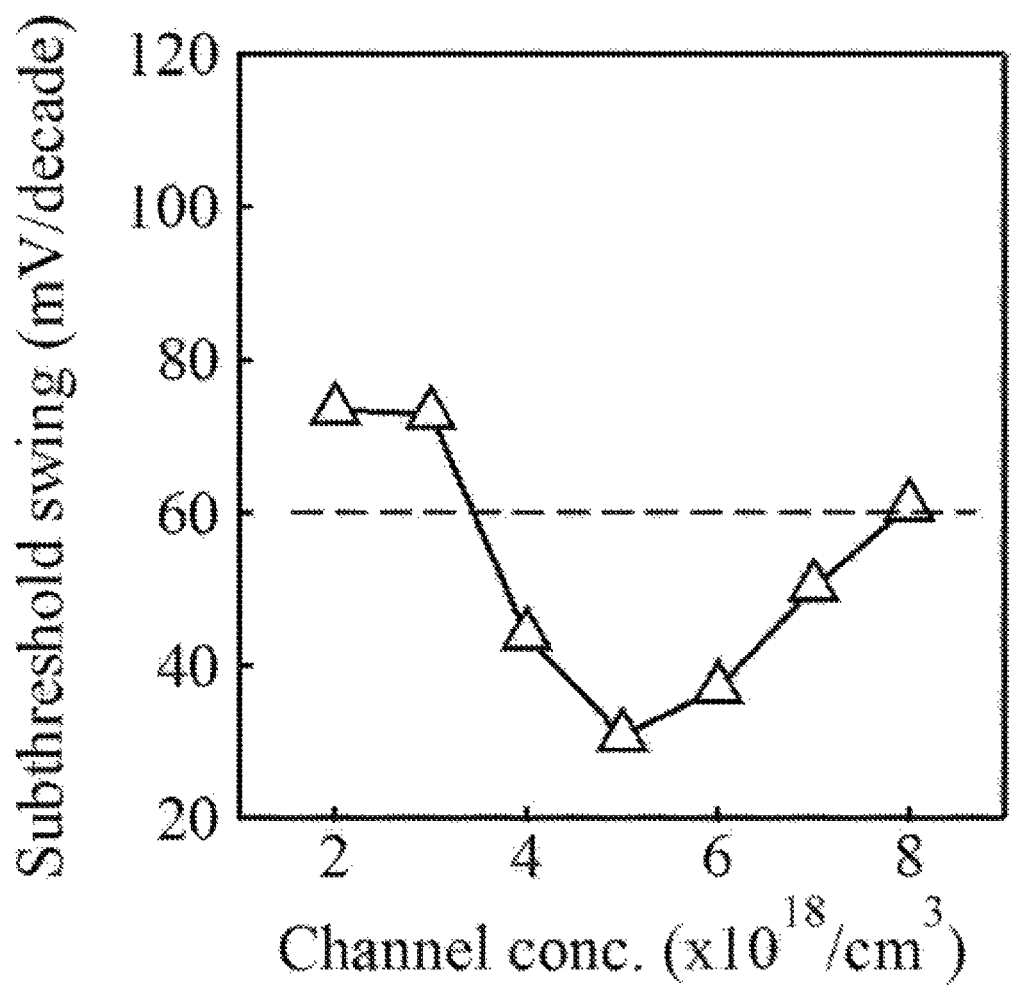
FIG. 11 is a graph plotting a result of calculation of a current change rate (Subthreshold swing) when an impurity concentration in a channel region is varied.

FIG. 11 plots a result of calculation of the current change rate (Subthreshold swing) when the impurity concentration in the channel region 25 was varied.

As plotted in FIG. 11, it is seen that a steep current rising characteristic in which the current change rate was lower than 60 mV/decade was obtained when the impurity concentration in the channel region 25 was from $4 \times 10^{18}/cm^3$ through $7 \times 10^{18}/cm^3$.

EXAMPLES

A film formation experiment was conducted in which a film of the nonlinearly responding dielectric having the same characteristic as that of the gate insulating film 27 used in the calculation of the simulation test was actually formed. Here, a $SrHfO_3$ film having a perovskite-type crystalline structure was formed as the film of the nonlinearly responding dielectric.

First, under an Ar gas atmosphere, sputtering targeting $SrO_2$ and $HfO_2$ was performed on a Si substrate set in a vacuum chamber of a RF sputter system (MPS-6000-MLT available from Ulvac, Inc.) under control of the plasma power of the targets and a shutter opening/closing time, to form a $SrHfO_3$ film having an adjusted chemical composition. Next, the Si substrate over which the $SrHfO_3$ film was formed was subjected to a heating treatment at 1,000° C. for 10 seconds under a nitrogen gas atmosphere, to form a $SrHfO_3$ film having a perovskite-type crystalline structure.

Figure 12:
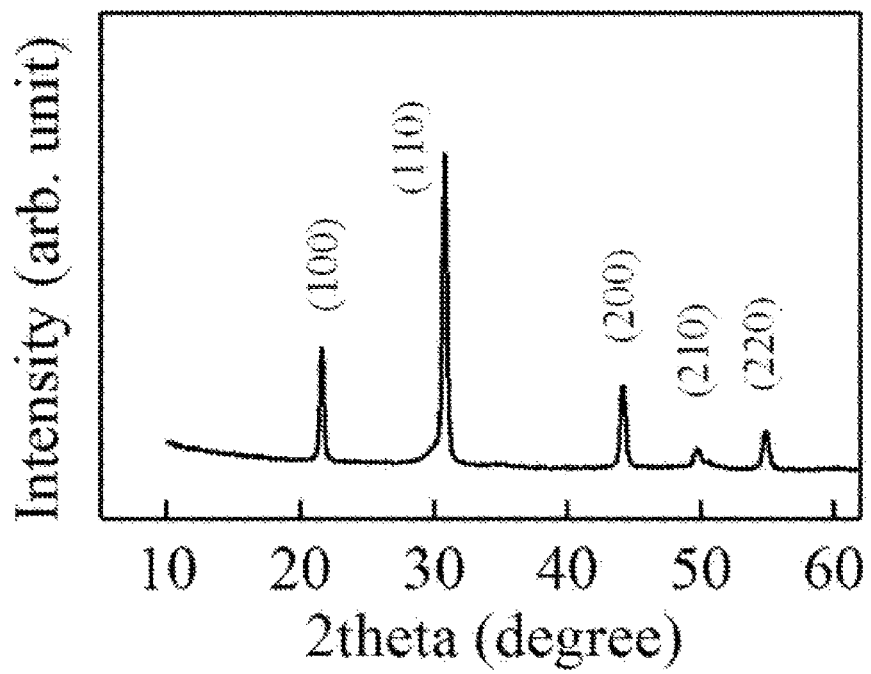
FIG. 12 is a graph plotting a result of measurement of a crystalline structure of a $SrHfO_3$ film.

FIG. 12 plots a result of measurement of the crystalline structure of the $SrHfO_3$ film by an in-plane X-ray analyzer (a high-resolution X-ray thin film evaluator SUPERLAB available from Rigaku Corporation). As plotted in FIG. 12, in the present film formation experiment, a single body film of $SrHfO_3$ having a perovskite-type crystalline structure could be formed over the Si substrate.

Figure 13A:
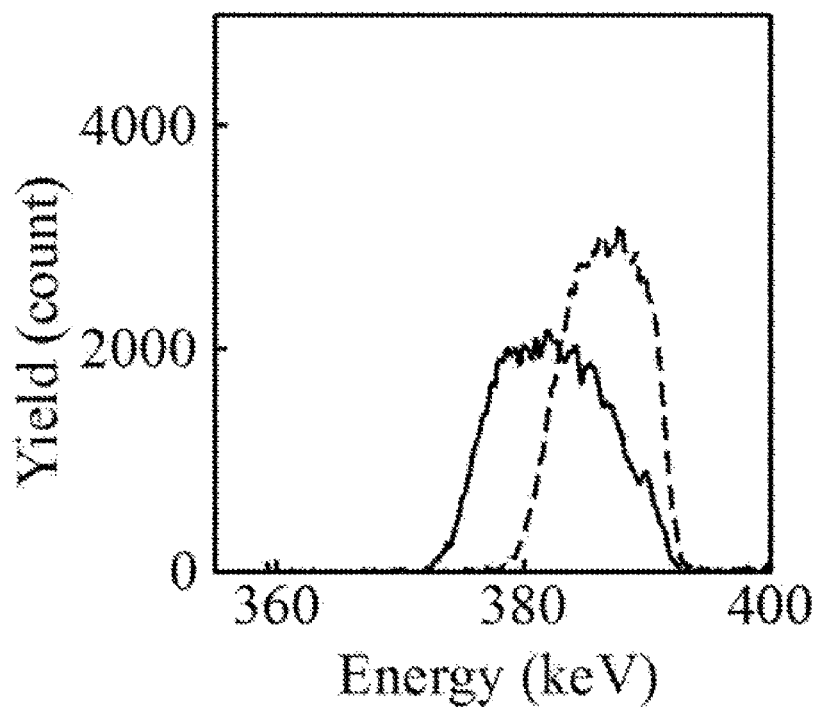
FIG. 13A is a graph plotting a result of measurement of a Sr atom depth distribution in a Si substrate over which a single body film of $SrHfO_3$ having a perovskite-type crystalline structure is formed.

Here, the Si substrate over which the single body film of $SrHfO_3$ having a perovskite-type crystalline structure was formed was measured for a Sr atom depth distribution with a Rutherford backscattering analyzer (HRBS500 available from Kobe Steel, Ltd.). The result of the measurement is plotted in FIG. 13A. In FIG. 13A, the solid line represents a Sr atom depth distribution after the heating treatment, and the dotted line represents a Sr atom depth distribution before the heating treatment.

As plotted in FIG. 13A, the position and width of the energy at and over which a signal intensity appeared before the heating treatment were different from those after the heating treatment. This suggests that some of the Sr atoms reacted with the Si substrate and diffused, to generate a dispersion in the depth distribution.

In view of this fact, a $HfO_2$ film having a thickness of 3 nm was once formed as an interfacial layer over a Si substrate, and then a $SrHfO_3$ film having a perovskite-type crystalline structure was formed over the $HfO_2$ film in the same manner as described above. Here, the $HfO_2$ film was formed with a RF sputter system (MPS-6000-MLT available from Ulvac, Inc.).

Figure 13B:
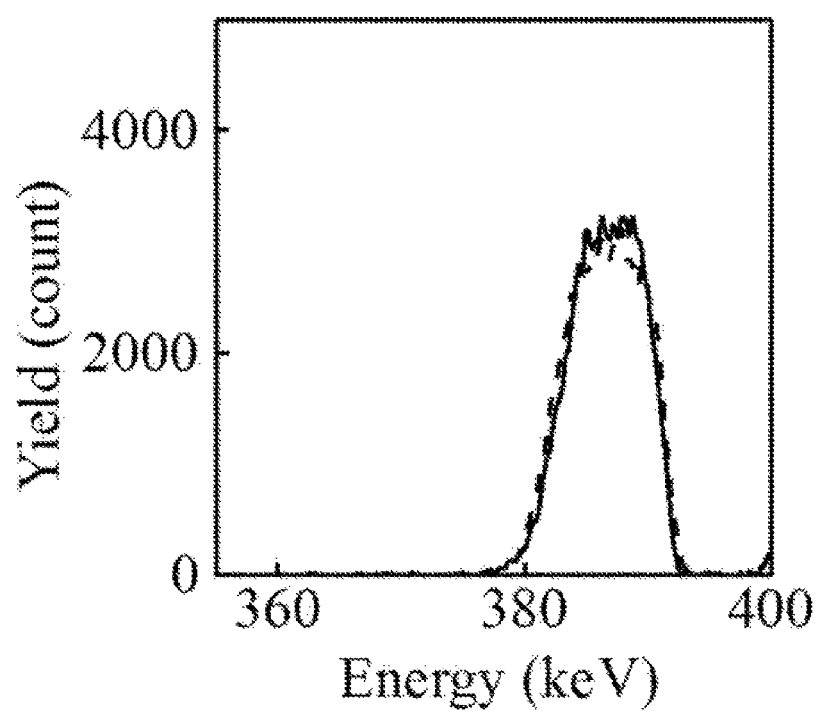
FIG. 13B is a graph plotting a result of measurement of a Sr atom depth distribution when an interfacial layer is formed.

The result of measurement of a Sr atom depth distribution when the interfacial layer was formed measured by the Rutherford backscattering analyzer is plotted in FIG. 13B. In FIG. 13B, the solid line represents a Sr atom depth distribution after the heating treatment, and the dotted line represents a Sr atom depth distribution before the heating treatment.

As plotted in FIG. 13B, when the interfacial layer was formed, the position and width of the energy at and over which a signal intensity appeared before the heating treatment were substantially the same as those after the heating treatment.

Hence, when the interfacial layer was formed, it was possible to suppress diffusion of the Sr atoms into the Si substrate.

REFERENCE SIGNS LIST 1, 21 support substrate
2, 22 insulating layer
3, 23 source region
4, 24 drain region
5, 25 channel region
6 interfacial layer 7, 27 gate insulating film
8, 28 gate electrode
9, 29 semiconductor layer
10, 20 field-effect transistor
31, 32 gate voltage-drain current characteristic of field-effect transistor
33 gate voltage-relative dielectric constant characteristic of field-effect transistor

The invention claimed is:

1. A field-effect transistor of an accumulation-layer-operation type, comprising:
    a semiconductor layer in which a source region, a channel region, and a drain region that have either an N-type or P-type conductivity in common are formed; and
    a gate electrode disposed adjacent to the channel region via a gate insulating film,
    wherein the gate insulating film is made of a dielectric having a change gradient of a relative dielectric constant in which the relative dielectric constant changes to decrease according to a magnitude of a gate voltage applied to the gate electrode; and
    wherein the dielectric has the change gradient of the relative dielectric constant in which when the gate voltage is modulated by 0.5 V, the relative dielectric constant becomes lower than or equal to a 0.5-times of the relative dielectric constant before modulation.

2. The field-effect transistor according to claim 1,
    wherein when an origin is defined as an electric field intensity of 0 where the electric field intensity is an intensity of an electric field applied to the dielectric, the dielectric has a local maximum value of the relative dielectric constant in a range of the electric field intensity that does not overlap the origin.

3. The field-effect transistor according to claim 1,
    wherein the dielectric is constituted by any one of: a superlattice structure formed by laminating layers of a metal oxide having a perovskite-type crystalline structure, a metal oxide having a fluorite-type crystalline structure, and a metal oxide having the perovskite-type crystalline structure of a different kind; a superlattice structure formed by laminating layers of metal oxides having the fluorite-type crystalline structure of different kinds; and a superlattice structure formed by laminating layers of a metal oxide having the perovskite-type crystalline structure and a metal oxide having the fluorite-type crystalline structure.

4. The field-effect transistor according to claim 1,
    wherein the semiconductor layer has a thickness of from 6 nm through 10 nm.

5. The field-effect transistor according to claim 1,
    wherein the channel region has an impurity concentration of from $4\times10^{18}$/cm$^3$ through $7\times10^{18}$ cm$^3$.

6. The field-effect transistor according to claim 1, further comprising:
    an interfacial layer disposed between the channel region and the gate insulating film.

7. The field-effect transistor according to claim 1,
    wherein the semiconductor layer is made of a material which is any one of silicon, germanium, tin, a mixed crystal of silicon and germanium, a mixed crystal of germanium and tin, and a group III-V compound.

8. The field-effect transistor according to claim 1,
    wherein the field-effect transistor has a transistor structure of any one of a bulk type, a SOI type, a fin type, and a nanowire-type.

* * * * *